US009742968B2

(12) United States Patent
Seger et al.

(10) Patent No.: US 9,742,968 B2
(45) Date of Patent: Aug. 22, 2017

(54) IMAGE ACQUISITION SYSTEM AND METHOD FOR THE MANUFACTURE THEREOF

(75) Inventors: Ulrich Seger, Warmbronn (DE); Gerald Franz, Backnang (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1688 days.

(21) Appl. No.: 12/295,063

(22) PCT Filed: Jan. 26, 2007

(86) PCT No.: PCT/EP2007/050764
§ 371 (c)(1),
(2), (4) Date: Jun. 2, 2011

(87) PCT Pub. No.: WO2007/110255
PCT Pub. Date: Oct. 4, 2007

(65) Prior Publication Data
US 2011/0260035 A1    Oct. 27, 2011

(30) Foreign Application Priority Data
Mar. 28, 2006   (DE) .......................... 10 2006 014 247

(51) Int. Cl.
*H04N 5/225*    (2006.01)

(52) U.S. Cl.
CPC ................................ *H04N 5/2254* (2013.01)

(58) Field of Classification Search
CPC .... H04N 5/2251; H04N 5/2254; H01L 21/56; H01L 21/67126; H01L 21/67376;
(Continued)

(56) References Cited

U.S. PATENT DOCUMENTS

| 4,280,132 A | * | 7/1981 | Hayakawa et al. ........... 257/667 |
| 4,843,036 A | * | 6/1989 | Schmidt et al. ................ 438/64 |

(Continued)

FOREIGN PATENT DOCUMENTS

| DE | 101 51 113 | 6/2003 |
| EP | 0 585 186 | 3/1994 |

(Continued)

OTHER PUBLICATIONS

International Search Report, PCT/EP2007/050764, dated May 18, 2007.

(Continued)

*Primary Examiner* — John Lee
(74) *Attorney, Agent, or Firm* — Norton Rose Fulbright US LLP; Gerard Messina

(57) ABSTRACT

An image acquisition system, in particular for automotive applications, includes: a substrate; an image sensor mounted on the substrate and contacted via contact points; an optically transparent sealing compound that covers the image sensor, the contact points, and a portion of the upper substrate side; an optical device being arranged or secured in or on the sealing compound. The optical device can be placed into the sealing compound after shaping of the sealing compound or directly. Furthermore, the optical device can also be arranged directly by shaping the sealing compound. Manufacture of the image acquisition system can be incorporated into a board populating process.

21 Claims, 4 Drawing Sheets

(58) Field of Classification Search
CPC ..... H01L 23/28; H01L 23/31; H01L 23/3107; H01L 23/3114; H01L 23/3121; H01L 23/3128; H01L 27/146; H01L 27/1462; H01L 27/14627
USPC ............. 250/239, 208.1, 216; 348/335, 340, 348/E5.024, E5.025, E5.026, E5.027, 348/E5.028; 257/431, 432, 433, 434, 257/435; 438/48, 64, 65
See application file for complete search history.

(56) References Cited

U.S. PATENT DOCUMENTS

| | | | | |
|---|---|---|---|---|
| 5,182,853 | A * | 2/1993 | Kobayashi et al. | 29/841 |
| 5,302,778 | A * | 4/1994 | Maurinus | 174/521 |
| 5,583,076 | A * | 12/1996 | Yoshizawa et al. | 438/64 |
| 6,117,705 | A * | 9/2000 | Glenn et al. | 438/106 |
| 6,246,123 | B1 * | 6/2001 | Landers et al. | 257/787 |
| 6,525,386 | B1 * | 2/2003 | Mills et al. | 257/433 |
| 6,830,711 | B2 * | 12/2004 | Mills et al. | 264/1.32 |
| 7,071,966 | B2 * | 7/2006 | Lu et al. | 348/188 |
| 7,084,922 | B2 * | 8/2006 | Miyake | 348/373 |
| 7,251,398 | B2 * | 7/2007 | Baets et al. | 385/52 |
| 7,332,784 | B2 * | 2/2008 | Mills et al. | 257/433 |
| 7,517,728 | B2 * | 4/2009 | Leung et al. | 438/122 |
| 7,550,204 | B2 * | 6/2009 | Shimizu et al. | 428/447 |
| 7,767,498 | B2 * | 8/2010 | Moro et al. | 438/126 |
| 2003/0067264 | A1 | 4/2003 | Takeuma | |
| 2003/0132495 | A1 * | 7/2003 | Mills et al. | 257/433 |
| 2003/0222333 | A1 * | 12/2003 | Bolken et al. | 257/678 |
| 2004/0150062 | A1 * | 8/2004 | Hsieh | H01L 27/14618 257/433 |
| 2004/0179243 | A1 * | 9/2004 | Hsieh | H04N 1/0313 358/474 |
| 2004/0179249 | A1 * | 9/2004 | Hsieh | H01L 31/0203 358/505 |
| 2004/0251509 | A1 | 12/2004 | Choi | |
| 2005/0072981 | A1 | 4/2005 | Suenaga | |
| 2005/0221518 | A1 * | 10/2005 | Andrews et al. | 438/27 |
| 2006/0006486 | A1 * | 1/2006 | Seo et al. | 257/433 |
| 2006/0038108 | A1 | 2/2006 | Belau | |
| 2006/0045421 | A1 * | 3/2006 | Baets et al. | 385/33 |
| 2006/0270094 | A1 * | 11/2006 | Choi | 438/64 |
| 2007/0007612 | A1 * | 1/2007 | Mills et al. | 257/433 |
| 2007/0099009 | A1 * | 5/2007 | Shimizu et al. | 428/447 |
| 2007/0279518 | A1 | 12/2007 | Apel et al. | |
| 2008/0087910 | A1 * | 4/2008 | Andrews et al. | 257/98 |
| 2009/0128684 | A1 * | 5/2009 | Apel | 348/360 |
| 2011/0018466 | A1 * | 1/2011 | Hutchins | 315/294 |
| 2011/0260035 | A1 * | 10/2011 | Seger et al. | 250/208.1 |
| 2013/0069544 | A1 * | 3/2013 | Hutchins | 315/158 |

FOREIGN PATENT DOCUMENTS

| | | |
|---|---|---|
| JP | 6-177271 | 6/1994 |
| JP | 8-330339 | 12/1996 |
| JP | 9-293901 | 11/1997 |
| WO | WO 2004/057857 | 7/2004 |
| WO | WO 2005/015897 | 2/2005 |
| WO | WO 2005/069602 | 7/2005 |

OTHER PUBLICATIONS

Gale, M.T. et al., "Active alignment of replicated microlens arrays on a charge-coupled device imager," Optical Engineering, vol. 36, No. 5, May 1997, pp. 1510-1517.

* cited by examiner

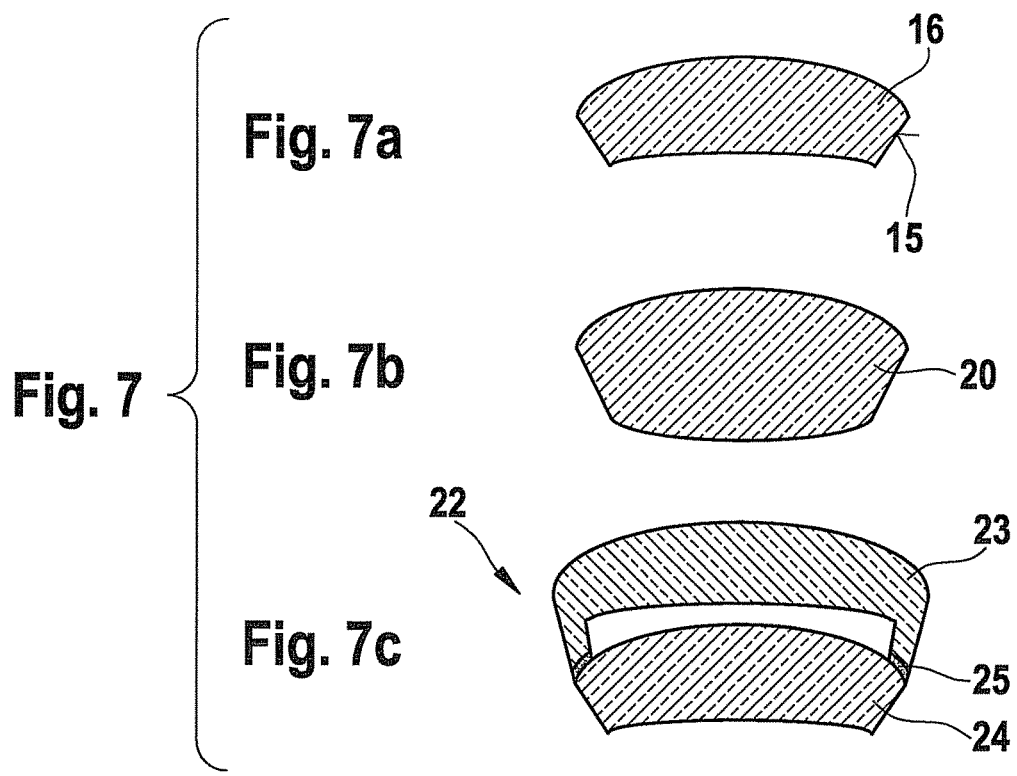
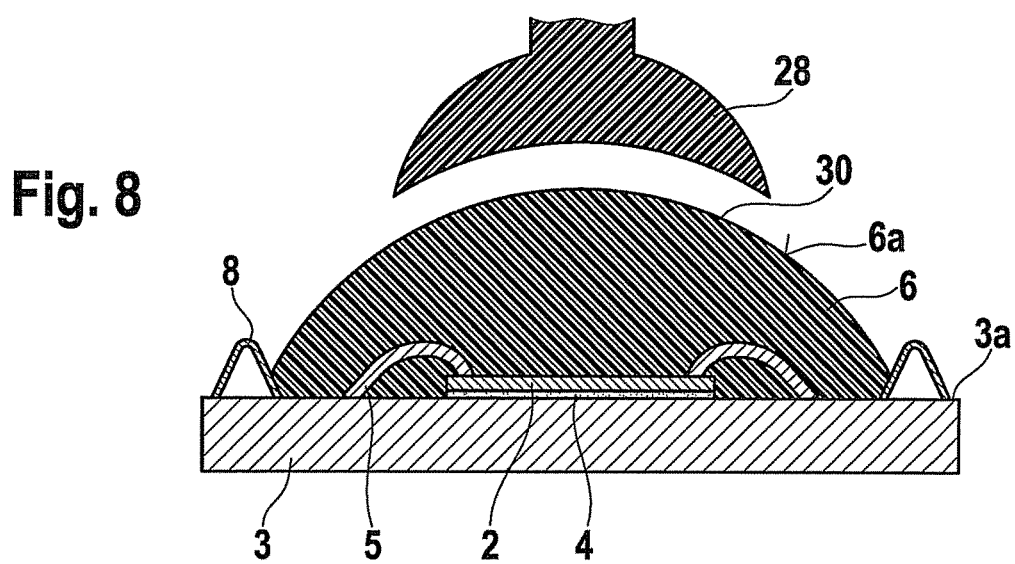

IMAGE ACQUISITION SYSTEM AND METHOD FOR THE MANUFACTURE THEREOF

FIELD OF THE INVENTION

The present invention relates to an image acquisition system and to a method for the manufacture thereof.

BACKGROUND INFORMATION

WO 2005/015897 discloses an image acquisition system that has an image sensor, an optical unit, a housing, and securing means for immobilizing the image sensor relative to the housing. Provided in the interior of the housing are alignment means that enable unsecured axial alignment of the main axes of the image sensor and optical unit with respect to one another. A threaded receptacle is advantageously provided as a means for receiving the optical unit of the housing.

An image acquisition system of this kind enables excellent optical accuracy. The construction is relatively complex, however, and generally requires laborious assembly and adjustment.

SUMMARY

Example embodiments of the present invention provide that an uncovered sealing compound is applied on the image sensor and its contact points on the substrate, which compound is optically transparent and thus enables passivation and protection from mechanical effects without impairing the image sensor's optical measurement. The image sensor can be, in this context, in particular a semiconductor component, e.g. an imager chip; a circuit board can be provided, in particular, as a substrate.

The optical device, e.g. a lens element or a lens system, can be applied or embodied in the sealing compound in accordance with a variety of configurations. Advantageously, manufacture of the image acquisition system can be integrated into the process of populating the substrate, i.e. manufacture is carried out in the board populating machine, so that manufacturing costs are kept low and large part volumes can be produced at low cost.

The image acquisition system according to example embodiments of the present invention can thus be manufactured in compact, secure, and stable fashion, yet still with low manufacturing costs and in large part volumes.

According to a first example embodiment, a receiving depression can be formed in the uncovered optically transparent sealing compound using, for example, a punch, and the optical device can subsequently be secured, e.g. adhesively bonded, in said receiving depression. According to a further example embodiment, the optical device is pressed directly into the not-yet-cured uncovered optically transparent sealing compound.

According to a further example embodiment, the applied uncovered optically transparent sealing compound can also be embodied directly as an optical device, for example by corresponding shaping of its surface region located in the optical axis, e.g. in the form of a lens region or a lens element. These example embodiments can also, in principle, be combined.

On the one hand mechanical protection and passivation of both the sensor and its contact points can thus be attained, so that high accuracy and longevity are achieved and the respective environmental influences such as temperature, humidity, etc. have, at most, little negative effect on image acquisition. On the other hand, it is possible to apply or embody a desired optical device that enables appropriate focusing of the image sensor onto a region to be viewed, i.e. a desired intercept distance or focal length. More-complex lens element systems can also, in principle, be mounted in this context, e.g. a stack of lens elements.

According to an example embodiment, the sealing compound has a refractive index similar to that of the material of the optical device (e.g. glass or plastic), so that the interfaces between the sealing compound and the optical device that is pressed or adhesively bonded in are not very relevant.

Example embodiments of the present invention will be explained below with reference to the attached drawings.

BRIEF DESCRIPTION OF THE DRAWINGS

FIG. 1 shows application of the sealing compound onto the image sensor;

FIGS. 2, 3 show surface shaping of the sealing compound;

FIG. 4 shows placement of a lens element into the shaped sealing compound;

FIG. 5 shows the image acquisition system with an adhesively mounted lens element;

FIG. 6 shows the manufacture of an image acquisition system in accordance with a further embodiment, with the lens element being directly pressed in;

FIG. 7 shows a variety of lens elements for use in the image acquisition system;

FIG. 8 shows an image acquisition system according to a further example embodiment, having a lens element arranged directly in the sealing compound.

DETAILED DESCRIPTION

Figure 1:
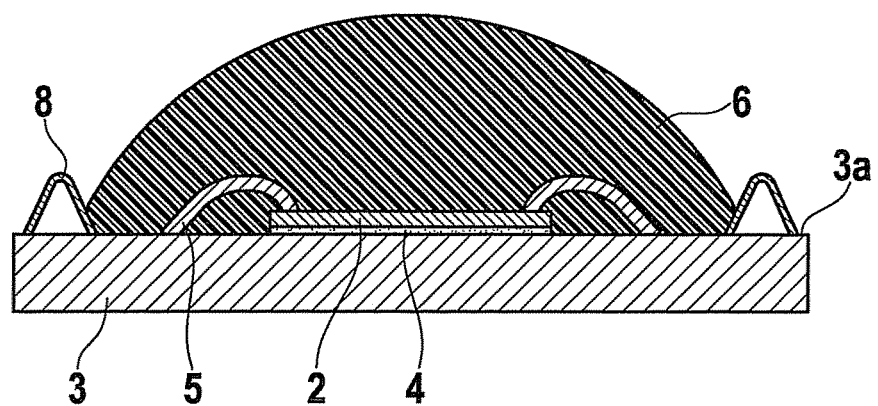
FIGS. 1 through 5 show, in vertical section, a method for manufacturing an image acquisition system in accordance with a first example embodiment.
Figure 5:
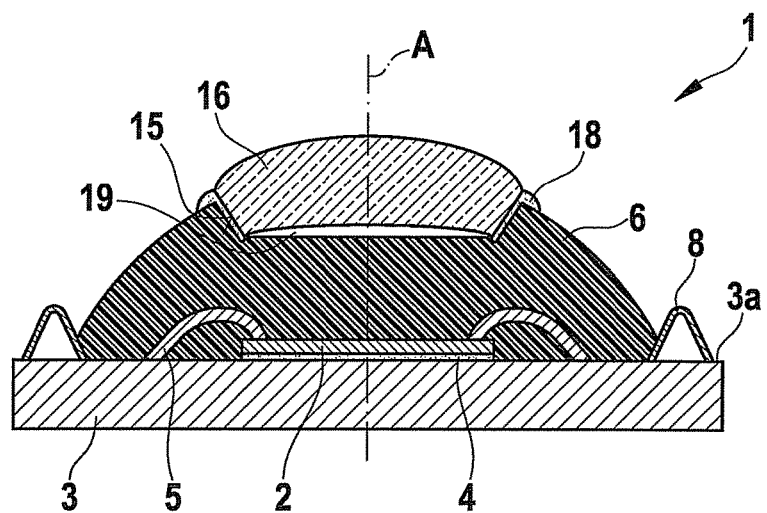

In order to manufacture an image acquisition system 1 shown in FIG. 5, according to FIG. 1 firstly an imager chip 2 constituting an image sensor is secured on upper substrate side 3a of a substrate 3, e.g. a circuit board 3, by way of, for example, an adhesive layer 4, and is contacted via bonding wires 5. A sealing compound (glob top) is then applied onto upper substrate side 3a such that it completely covers imager chip 2 and its wire bonds 5. A delimiter 8 for delimiting the applied sealing compound 6 is advantageously provided on upper substrate side 3a. Delimiter 8 can be embodied, as shown in FIG. 1, in particular by a rim 8 configured peripherally, i.e. in particular annularly, on substrate 3. Also possible, however, are stop edges at which excess material is discharged to the side in the event of an overflow.

As shown in FIG. 1, uncovered optically transparent sealing compound 6 is advantageously applied in liquid or viscous or pasty fashion in a convex shape, e.g. droplet shape, which is promoted by sufficient viscosity of sealing compound 6; this already causes a lens-like shape to form. Sealing compound 6 can be cured, for example, using UV radiation.

According to example embodiments of the present invention, sealing compound 6 is optically transparent, i.e. at least in a relevant wavelength region, to the radiation to be detected. Imager chip 2 can serve in particular to receive light in the optical wavelength region; applications in the IR spectral region are, however, also possible in principle. Sealing compound 6 serves as a passivating agent for passivation and mechanical protection of imager chip 2 and its bonding wires 5 and of the contacted surfaces on substrate 3, e.g. bonding pads, without impairing reception of the relevant radiation.

Figure 2:
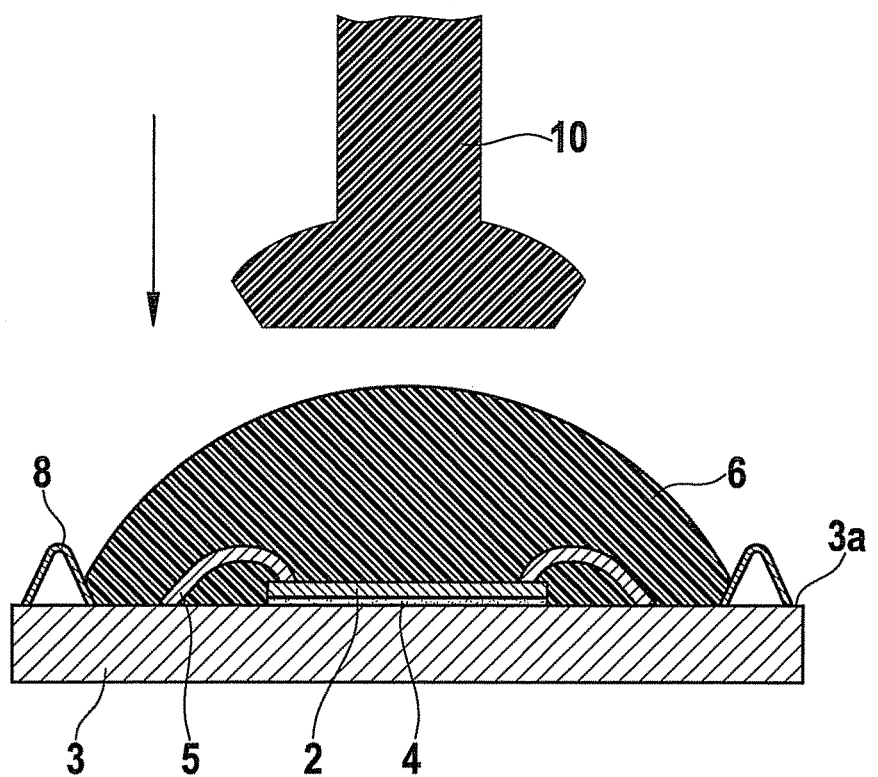
Figure 3:
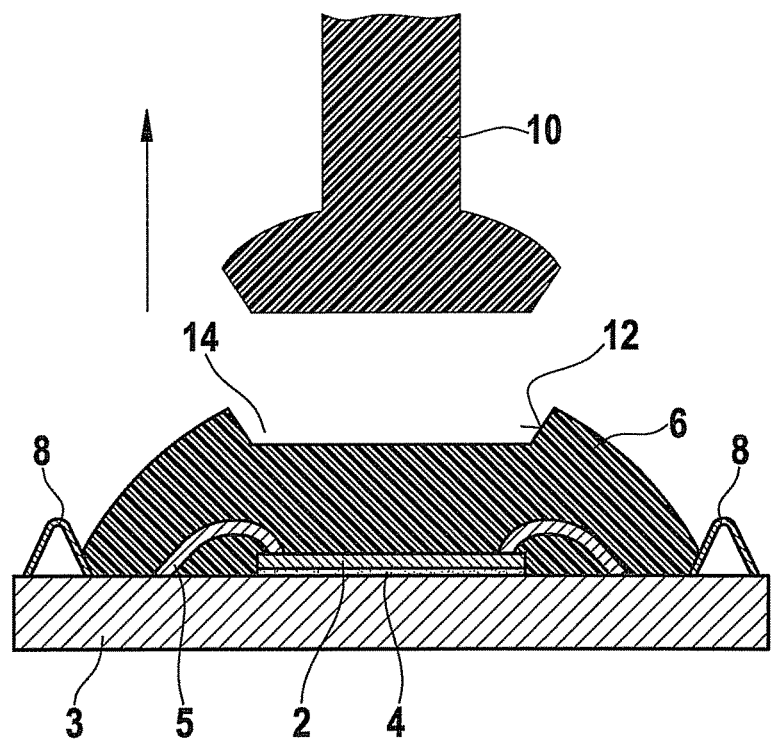
Figure 4:
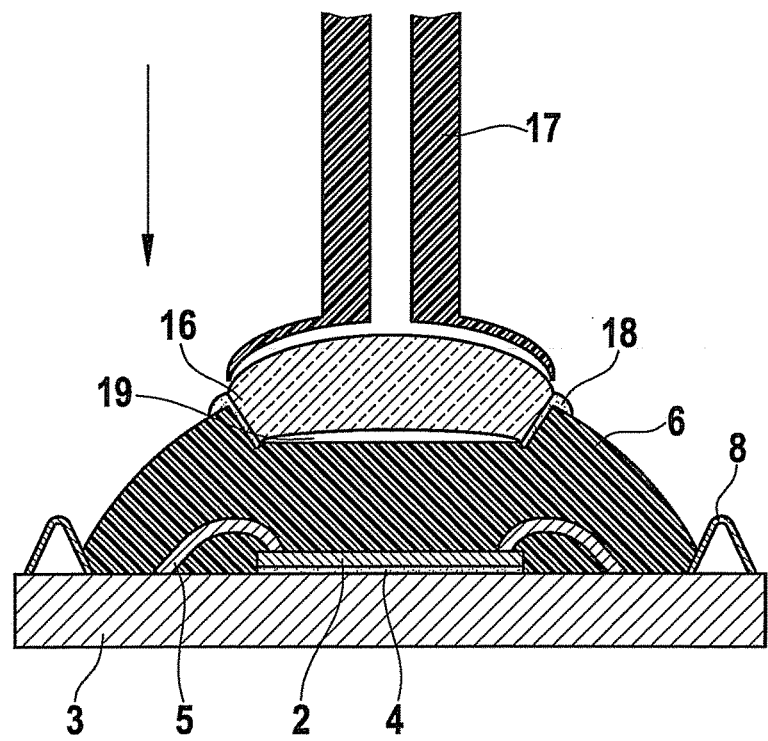

As shown in FIGS. 2 and 3, uncovered optically transparent sealing compound 6 is then mechanically deformed from above by way of a punch 10, whereupon punch 10 is pulled back again. Different shapes of surface 12 of sealing compound 6 can thereby be configured. As shown in FIG. 3, a receiving depression 14 can be embodied, and after curing of the uncovered optically transparent sealing compound, in a subsequent method step shown in FIG. 4, a lens element 16 constituting an optical unit is inserted from above using an application tool 17, and is secured, e.g. by way of adhesive 18, in receiving depression 14. Adhesive 18 can previously be applied on lens element 16 or on lateral adhering surfaces 15 of the corresponding optical unit 22 for this purpose. A UV-curing adhesive 18 can, for example, be used, and can subsequently be cured. This thereby forms image acquisition system 1 shown in FIG. 5, having substrate 3, imager chip 2, optically transparent sealing compound 6, and lens element 16 secured thereabove. As shown in FIG. 5, a clearance 19 can remain between lens element 16 and optically transparent sealing compound 6. Alternatively thereto, a direct embedding of lens element 16 into sealing compound 6, i.e. without clearance 19, can also occur, so that only one interface is present here. In the portions of the optically transparent sealing compound not receiving the lens element 16 or embedded with lens element 16, the optically transparent sealing compound is uncovered. Advantageously, adhesive 18 is provided only laterally farther outside optical axis A, so that it does not influence the beam path. An optically transparent adhesive 18 can, however, also in principle be provided between lens element 16 and sealing compound 6 in the optically relevant region.

As shown in FIGS. 1 to 5, receiving depression 14 is thus arranged as a mechanical functional surface 14, i.e. as a lens mount or lens seat.

Figure 6:
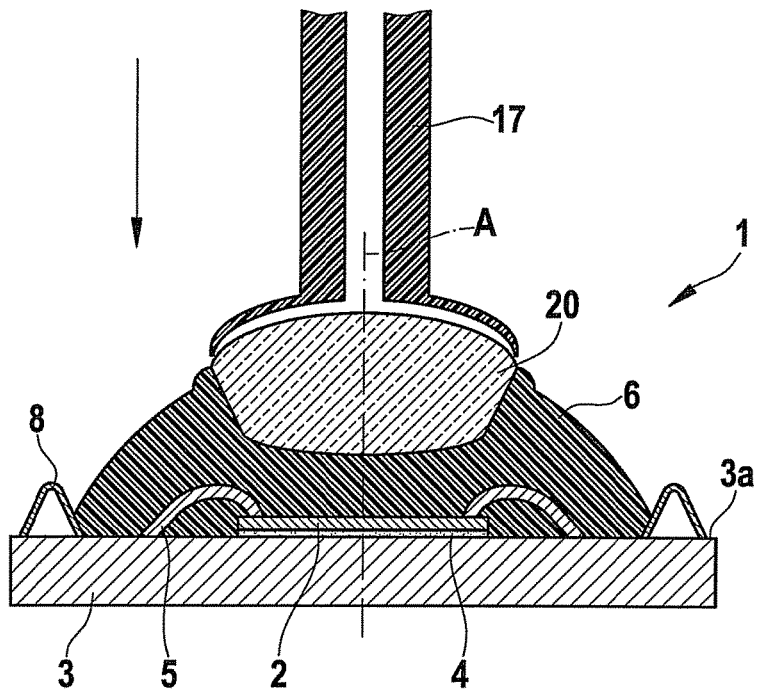

As shown in FIG. 6, a lens element 20 can also be pressed directly into optically transparent sealing compound 6 by way of application tool 17, e.g. a vacuum suction bell 17, so that no adhesive 18 is provided. This embodiment, too, yields a defined optical beam path, since sealing compound 6 is deformed or pushed outward only in regions located laterally farther out with respect to optical axis A; sealing compound 6 and lens element 20 are provided above imager chip 2 in the region of beam path A. With this embodiment, the respectively applied lens element 18, 20, or an optical unit 22, can be secured by mounting an additional locking device from above, e.g. a locking ring that is pressed into sealing compound 6 and immobilizes the edge of the respective lens element 18, 20.

In addition to convex lens element 16 of FIG. 5 and the biconvex lens element of FIGS. 6 and 8b, other shapes can also be provided, for example optical units 22 according to FIG. 7 made up of multiple lens elements 23, 24 that are connected to one another, for example, via adhesive material 25.

It is also possible correspondingly to shape the applied uncovered optically transparent sealing compound 6 directly as an optical unit. FIG. 8 shows an example in which the applied sealing compound 6 is shaped from above by a punch 28 at least in a central region in its surface 6a that is relevant for the optical beam path. This therefore yields a lens region 30 in surface 12 of sealing compound 6, which region can, in particular, be embodied convexly in order to focus the incident radiation. Lens region 30 can subsequently be ground and/or polished. In this example embodiment, lens region 30 is thus configured as a functional surface in sealing compound 6. Depending on the configuration of the optical unit, a concave configuration of lens region 30 may also be advantageous in order to compensate for aberrations of the optical unit.

The desired optical properties can be influenced by the selection of suitable refractive indices of lens elements 16, or the various lens elements 23, 24 of optical unit 22, and of sealing compound 6.

All the method steps can be carried out in the board populating machine, i.e. in the context of board population. After the mounting of imager chip 2 and bonding wires, a drop of sealing compound 6 is then applied and, before curing, lens element 16 is set in place the respective punch 10 or via application tool 17. According to FIG. 8 as well, the shaping of sealing compound 6 by way of punch 28 can be carried out during the board population process.

The refractive indices of sealing compound 6 and of the glass or plastic material of lens elements 16, 20 or 23, 24 can be similar or even identical, so that the interfaces make only a small contribution to the overall refractive power of the optical system.

Image acquisition system 1 can serve, in particular, as a fixed-focus system having a fixed focal length. For correct focusing and therefore high image quality, the image-side intercept distance can be defined for this purpose by a variety of actions. On the one hand, the image-side intercept distance or focal length of the respective lens 16, 20 or optical unit 22 can be known or instantaneously determined prior to insertion into sealing compound 6.

Also possible is real-time focusing in the populating machine in order to optimize contrast. Several focusing possibilities can be utilized for this:

a) The support points of lens element 16, 20 or optical unit 22 are machined, e.g. ground, in controlled fashion so that the position of image sensor 1 after assembly coincides with the intercept distance. In the example embodiment of FIGS. 1 to 5, the support point of lens element 16 is defined by adhesively bonded surface 15.

b) As they are bonded in, lens element 16, 20 or optical unit 22 is held in the best-focus position, in which the image plane lies on imager chip 2, until adhesive material 18 and/or sealing compound 6 has cured. In the example embodiment of FIGS. 1 to 5, adhesive material 18 cures in this context. In the embodiment of FIG. 6, sealing compound 6 cures; here as well, lens element 18 is brought into the best-focus position; when the image-side intercept distance is known, this is accomplished directly by the populating machine or via application tool 17.

With this type of best-focus positioning, during the curing operation light or radiation is directed along optical axis A onto the respective lens element 16, 20 or optical unit 22, and the measured signal of imager chip 2 is evaluated; in general, the respective lens element is retained or minimally displaced as a function of the image signal of imager chip 2, said signal generally being regulated to an optimum value.

The image acquisition system according to the present invention can be used in motor vehicles for various purposes, e.g. for seat detection, to monitor the tank and other parts of the motor vehicle, and to sense and detect the vehicle's surroundings, in particular to sense and detect road condition or other traffic, for pre-crash sensing and as an overtaking aid, and to detect traffic signs and the area surrounding the road as a supplement to digital road maps. The image sensors used in this context are, in particular, economical semiconductor elements, e.g. CCD linear arrays or CCD or CMOS matrix arrays.

What is claimed is:

1. An image acquisition system, comprising:
   a substrate;
   an image sensor mounted on the substrate and contacted via contact points;
   an uncovered, optically transparent sealing compound that covers the image sensor, the contact points, and a portion of an upper substrate side, wherein:
      the sealing compound includes an uneven outer surface in the shape of a receiving depression, and
      the receiving depression is directly above the image sensor; and
   an optical device secured in the receiving depression of the uncovered optically transparent sealing compound, wherein the optical device is pressed into the sealing compound and positively held thereby so that light that impinges on the image sensor in a direction perpendicular to a light receiving surface of the image sensor first travels through the optical device in the receiving depression and through the sealing compound prior to impinging on the image sensor.

2. The image acquisition system according to claim 1, wherein the image acquisition system is adapted for an automobile application.

3. The image acquisition system according to claim 1, wherein the optical device includes at least one of (a) a lens element and (b) a lens element system.

4. The image acquisition system according to claim 1, wherein the optical device is adapted to focus incident light onto the image sensor.

5. The image acquisition system according to claim 1, wherein the optical device is adhesively bonded to the receiving depression of the sealing compound.

6. The image acquisition system according to claim 1, wherein the image sensor is completely encapsulated on the substrate.

7. The image acquisition system according to claim 1, wherein the sealing compound is delimited by at least one delimiter mounted on the substrate.

8. A method for manufacturing an image acquisition system, comprising:
   securing and contacting at least one image sensor on a substrate;
   applying an uncovered optically transparent sealing compound onto the substrate such that it covers the image sensor and its contact points;
   pressing an optical device into an uneven outer surface of the uncovered, optically transparent sealing compound that is in the shape of a receiving depression, so that light that impinges on the image sensor in a direction perpendicular to a light receiving surface of the image sensor first travels through the optical device in the receiving depression and through the sealing compound prior to impinging on the image sensor.

9. The method according to claim 8, wherein the receiving depression is formed by impression by a punch in the sealing compound while the sealing compound is uncured.

10. The method according to claim 8, wherein the optical device is pressed into an as-yet-uncured sealing compound.

11. The method according to claim 8, wherein at least one of (a) the arranging and (b) the mounting of the optical device includes a populating method for populating the substrate.

12. The method according to claim 11, wherein real-time focusing of the image sensor is accomplished in the populating method.

13. The method according to claim 12, wherein upon at least one of (a) adhesive bonding and (b) placement into the sealing compound, the optical device is held, until at least one of (a) an adhesive material and (b) the sealing compound that immobilizes it has cured, in a best-focus position in which an image plane is located on the image sensor.

14. The method according to claim 13, wherein during a curing operation of at least one of (a) the adhesive material and (b) the sealing compound, at least one of (a) light and (b) radiation is radiated along an optical axis onto the optical device, and a measured signal of the image sensor is evaluated, the position of the optical device being modified as applicable.

15. The image acquisition system according to claim 3, wherein the at least one of (a) the lens element and (b) the lens element system includes at least one of (i) a convex lens element, (ii) a biconvex lens element, and (iii) multiple lens elements connected to one another.

16. The method according to claim 14, wherein the curing operation of at least one of (a) the adhesive material and (b) the sealing compound is performed by applying UV radiation.

17. The image acquisition system according to claim 7, wherein the at least one delimiter includes an at least one stop edge.

18. The method according to claim 14, wherein the curing operation of at least one of (a) the adhesive material and (b) the sealing compound is performed by applying UV radiation.

19. The image acquisition system according to claim 7, wherein the at least one delimiter includes an at least one stop edge.

20. The image acquisition system according to claim 1, wherein a clearance is present between a surface of the receiving depression and a surface of the optical device.

21. The method according to claim 8, further comprising providing a clearance between a surface of the receiving depression and a surface of the optical device.

* * * * *